United States Patent
Avelar Araujo et al.

(10) Patent No.: US 10,436,324 B2
(45) Date of Patent: Oct. 8, 2019

(54) PISTON RING FOR INTERNAL COMBUSTION ENGINES

(71) Applicants: Mahle Metal Leve S/A, Jundiai (BR); Mahle International GmbH, Stuttgart (DE)

(72) Inventors: Juliano Avelar Araujo, Jundiai (BR); Paulo Jose Da Rocha Mordente, Jundiai (BR); Robert R. Banfield, Sao Paulo (BR)

(73) Assignees: Mahle Metal Leve S/A (BR); Mahle International GmbH (DE)

( * ) Notice: Subject to any disclaimer, the term of this patent is extended or adjusted under 35 U.S.C. 154(b) by 592 days.

(21) Appl. No.: 15/131,017

(22) Filed: Apr. 17, 2016

(65) Prior Publication Data
US 2016/0305547 A1 Oct. 20, 2016

(30) Foreign Application Priority Data
Apr. 17, 2015 (BR) .............................. 102015008817

(51) Int. Cl.
*F16J 9/26* (2006.01)
*F16J 9/12* (2006.01)
(Continued)

(52) U.S. Cl.
CPC .............. *F16J 9/26* (2013.01); *C23C 14/0036* (2013.01); *C23C 14/022* (2013.01);
(Continued)

(58) Field of Classification Search
USPC ........ 428/216, 336, 697, 698, 699; 277/442; 123/193.1, 193.6
See application file for complete search history.

(56) References Cited

U.S. PATENT DOCUMENTS

2005/0170162 A1 * 8/2005 Yamamoto .......... C23C 14/0036
428/216
2008/0073482 A1 * 3/2008 Inoue .................... C23C 14/024
249/116
(Continued)

FOREIGN PATENT DOCUMENTS

BR PI1102335 A2 6/2013
BR PI1102336 A2 6/2013
(Continued)

OTHER PUBLICATIONS

Beliardough et al "Tribological performance of Cr/CrN and Cr/CrN/CrAlN multilayered coatings deposited by r. f. magnetron sputtering" 40th Leeds-Lyons Symposium on Tribolochemistry Forum 2013 Sep. 4-6, 2013, Lyons France. (Year: 2013).*
(Continued)

*Primary Examiner* — Archene A Turner
(74) *Attorney, Agent, or Firm* — Fishman Stewart PLLC

(57) ABSTRACT

A piston ring for an internal combustion engine may include a substantially annular base of a ferrous alloy upon which is applied a coating. The coating may have a first bonding layer and at least a first external layer or a second external layer deposited upon the first bonding layer up to a maximum of 100 micrometers in thickness of a plurality of sequentially deposited first and second external layers. The first external layer may include a nitride of a doped metal chemical element, a doping element being aluminum. The second external layer may include a nitride of the metal chemical element. The first external layer may have a thickness greater than at least once a thickness of the second external layer and less than ten times the thickness of the second external layer.

13 Claims, 3 Drawing Sheets

(51) Int. Cl.
*C23C 14/00* (2006.01)
*C23C 14/02* (2006.01)
*C23C 14/06* (2006.01)
*C23C 14/16* (2006.01)
*C23C 14/34* (2006.01)
*C23C 14/35* (2006.01)

(52) U.S. Cl.
CPC ........ *C23C 14/0641* (2013.01); *C23C 14/165* (2013.01); *C23C 14/3485* (2013.01); *C23C 14/352* (2013.01); *F16J 9/12* (2013.01)

(56) References Cited

U.S. PATENT DOCUMENTS

2009/0123737 A1* 5/2009 Yasui .................. C23C 8/80
428/336
2010/0129644 A1* 5/2010 Endrino ................ C23C 30/00
428/336
2011/0045264 A1* 2/2011 Heutling ............... C23C 14/027
428/216

FOREIGN PATENT DOCUMENTS

| EP | 2716790 A1 | 4/2014 |
| EP | 2716791 A2 | 4/2014 |
| EP | 1851361 B1 | 4/2016 |
| JP | 2007-111815 | * 5/2007 |
| WO | WO2014/088096 | * 6/2014 |

OTHER PUBLICATIONS

German Search Report for DE 10 2016 206 094.5 dated Dec. 9, 2016.

Hovsepian Coating Technoligies Surface Coatings Technology Report dated Mar. 27, 2009.

Vetter Coatings, Coatings Deposited by the Cathodic Vacuum Arc Evaporation, Article 98 (1998) 1233-1239.

\* cited by examiner

PISTON RING FOR INTERNAL COMBUSTION ENGINES

RELATED APPLICATIONS

This application claims priority to Brazilian Patent Application No. 10 2015 008817 5, filed Apr. 17, 2015, the contents of which are hereby incorporated by reference in their entirety.

TECHNICAL FIELD

The present invention relates to a piston ring for internal combustion engines wherein at least the base of the piston ring is provided with a multilayer coating composed of nitrides, the coating being applied by a process of physical vapor deposition and offering excellent resistance to wear by virtue of the high adherence of the coating to the base, lower internal stress, high hardness and low porosity.

BACKGROUND

Internal combustion engines are basically constituted by two principal parts: an engine block (provided with one or more cylinders) and a cranked shaft assembly or crankshaft assembly wherewith are associated one or more heads. The cranked shaft assembly contains pistons, connecting rods and the crankshaft, this assembly being responsible for the displacement of the pistons within the cylinders of the engine block. The piston is a cylindrical part, as a rule composed of a metal base, and comprises one or more rings responsible for providing a sliding seal between the external rim of the piston and the internal wall of the cylinder.

As a rule, the more modern 4-stroke engines utilize three rings on each piston, two being compression rings and one being an oil ring. The two rings located closest to the head of the piston are denominated compression rings and serve to prevent leakage of the gaseous mixture to the interior of the crankcase at the moment when the piston performs the compression movement. The third ring of the piston is denominated an oil ring and has the purpose of scraping the excess oil from the cylinder wall, controlling the thickness of the oil film.

In general, piston rings are formed by a metal external base to which is applied at least one layer of coating appropriate for coming into contact with the cylinder wall. The function of the coating is very important by virtue of the fact that it seeks to confer on the ring properties of low sliding friction, high resistance to wear, hardness and toughness.

As a rule, the application of layers of coating is performed by ion coating processes, particularly physical vapor deposition (PVD), chemical vapor deposition (CVD) or by an electrolytic coating process.

Among the processes utilized for coating piston rings, the physical vapor deposition (PVD) process presents interesting advantages such as, for example, the possibility of the process operating at very low working pressures, rendering feasible the sintering of materials of high purity, improvement in the adhesion of the coating to the base by virtue of the possibility of "cleaning" the surface of the base by means of an ionic bombardment; uniform coating thickness, control of the crystalline structure of the coating, no effluents or pollutants being utilized whatsoever by virtue of the fact that, in the majority of cases, toxic products or solutions are not involved and the deposition temperatures are relatively low.

The basic processes for physical vapor deposition (PVD) are known as evaporation and sputtering. The cathodic arc (evaporation) produces a superficial micromelting of the target cathode, sputtering droplets of liquid or macroparticles (particles of liquid or solid debris produced in the cathodic arc process). These macroparticles may vary in size up to approximately 100 nanometers, the average diameter of these macroparticles lying between 5 and 30 nanometers, and they affect many properties of the coatings, such as friction, wear, resistance to corrosion, resistivity and reflectivity.

The resistance to corrosion, for example, is compromised when a macroparticle is incorporated into the coating, it being possible to consider it as a discontinuity in a dense and continuous coating. As a rule, one possible course of action is considered, the utilization of filters, however these filters reduce the rate of deposition and increase the complexity and cost of the equipment.

The PVD sputtering process is a non-thermal vaporization involving the ejection of atoms or molecules from a source. An evolution of this technique such as, for example, the high power impulse magnetron sputtering (HiPIMS) method, renders possible the obtainment of coatings lacking the presence of dense macroparticles, rendering the application thereof to piston rings feasible.

At the present time, the piston rings of the prior art are provided with an external base or sliding base provided with a monolayer coating of chromium nitride (CrN), providing high resistance to wear. This coating is obtained by a cathodic arc PVD process.

When utilized in engines having a high load and a high level of combustion pressure, this coating presents fragile behavior, leading to the appearance of microfractures in the base of the piston rings, by virtue of the high internal stress. These microfractures propagate, leading to the detachment of small pieces of the coating, generating voids in the base, and may even score the surface of the cylinder liner.

Moreover, there exists the possibility of formation of macroparticles, as described above, having the possibility of leading to the loss of the adhesion of the coating layer on the base, in addition to generating a rough surface and leading to a decrease in the porosity of the sliding base, effects which are undesirable for a piston ring coating.

Prior art documents PI 1102335-0 and PI 1102336-8, having the same owner as the present invention, reveal the utilization of a high power impulse magnetron sputtering (HiPIMS) process for obtaining a monolayer coating on elements provided with sliding surfaces for use in internal combustion engines. Such deposition process confers high resistance to wear, in addition to low internal stress.

It should be noted that the coatings presented in the prior art are of the monolayer type, that is to say just one deposited layer. According to the deposition process, the monolayer coating presents greater or lesser resistance to wear, without however presenting strength sufficient and ideal for utilization on piston rings of high load engines.

Consequently, the obtainment of a piston ring is rendered necessary wherein at least the base of the piston ring is provided with a multilayer coating composed of nitrides, said coating offering excellent resistance to wear by virtue of the high adherence of the coating to the base, lower internal stress, high hardness and low porosity.

SUMMARY

The object of the present invention is to provide a piston ring comprising a base provided with a multilayer coating ensuring excellent resistance to wear by virtue of the high adherence of the coating to the base, lower internal stress, high hardness and low porosity.

An additional object of the present invention is to provide a piston ring comprising a base provided with a coating composed of a metal nitride applicable by a cathodic arc deposition process or by a physical vapor deposition (PVD) process, by a method of high power impulse magnetron sputtering (HiPIMS).

The objects of the present invention are achieved by a piston ring for internal combustion engines provided with a substantially annular base of a ferrous alloy upon which is applied a coating comprising a first bonding layer and at least a first or a second external layer deposited upon the first bonding layer up to a maximum of 100 micrometers in thickness of a plurality of sequentially deposited first and second external layers, the first external layer being composed of a nitride of a doped metal chemical element (x), the doping element being aluminum (Al), the second external layer composed of a nitride of the metal chemical element (x), the first external layer provided with a thickness greater than at least once the thickness of the second external layer and less than ten times the thickness of the second external layer.

The objects of the present invention are also achieved by a piston ring comprising the metal chemical element (x) selected from among chromium (Cr) or titanium (Ti) or niobium (Nb), the first and second external layers being provided with a thickness of between 1 and 200 nanometers, the coating comprising a second bonding layer deposited upon the first bonding layer, the first bonding layer being composed of chromium (Cr) or chromium/aluminum (CrAl) and the second bonding layer being composed of a doped chromium nitride, the doping element being aluminum (CrAlN), or a chromium nitride (CrN), the coating composed of the first and second bonding layers and first and second external layers presenting a hardness between 1800 and 2500 HV (Vickers hardness), a porosity of 3% to 6% and an internal stress of between 200 and 700 MPa (megapascals).

The objects of the invention are additionally achieved by a process for obtaining a piston ring for internal combustion engines, the coating comprising a first bonding layer, a second bonding layer, a first external layer and a second external layer, the coating being deposited by a cathodic arc deposition process or by a physical vapor deposition (PVD) process, by a method of high power impulse magnetron sputtering (HiPIMS).

Furthermore, the objects of the present invention are achieved by an internal combustion engine comprising at least one piston ring as defined above.

BRIEF DESCRIPTION OF THE DRAWINGS

The present invention shall be described in greater detail based on an example of embodiment represented in the drawings. In the figures.

DETAILED DESCRIPTION

Figure 1:
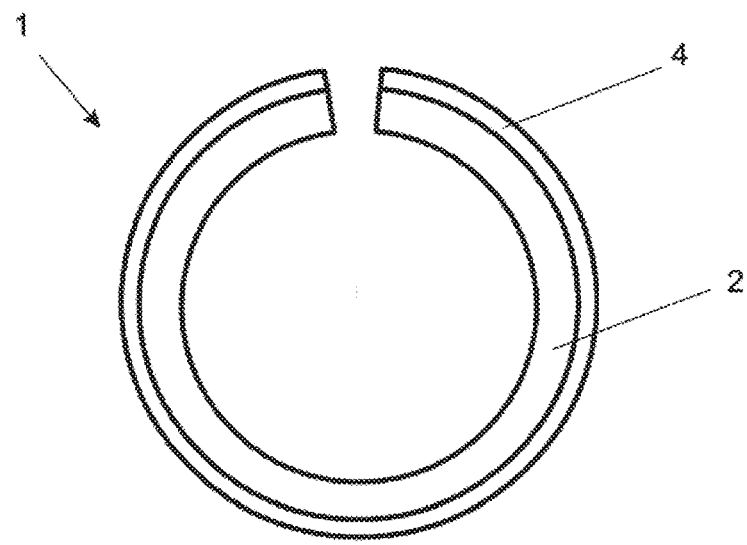
FIG. 1 shows an upper view of a piston ring of the present invention and the constituent parts thereof.

The present invention relates to a piston ring 1 for internal combustion engines provided with a substantially annular base 2 of a ferrous alloy upon which is applied a multilayer coating 4 comprising a first bonding layer 10 and at least a first external layer 11 or a second external layer 12 deposited upon the first bonding layer 10 up to a maximum of 100 micrometers in thickness of a plurality of sequentially deposited first and second external layers 11, 12, so as to confer on the piston ring 1 excellent resistance to wear by virtue of the high adherence of the coating to the base, lower internal stress, high hardness and low porosity.

For the proper comprehension of the present invention an initial clarification is rendered necessary with reference to the utilization of piston rings 1 for internal combustion engines and with reference to the processes utilized for application of a coating 4 upon the piston rings 1.

In a general manner, the piston ring 1 is a self-expanding element, that is to say an elastic element having high expansive force, having as the purpose thereof the promotion of sealing the gases of a combustion chamber of internal combustion engines, together with performing the control of the film of lubricating oil on the wall of a cylinder, and serving as an element of transmission of heat from the piston to the cylinder.

The piston rings 1, under working conditions, are subject to the most adverse conditions possible, which can cause them to suffer premature wear. Among the principal causes of this wear may be cited, inter alia, insufficient lubrication, engines working under high loads, among many other factors which expose the surfaces of the piston rings to severe processes of wear through abrasion or scuffing.

Having the objective of minimizing the wear and prolonging the working life of the piston rings 1, on the external working surface coverings or coatings are generally utilized which comprise materials which are harder and more resistant than the material of the rings 1.

These coatings are usually deposited by ion coating processes. Among these processes, the physical vapor deposition (PVD) process is widely utilized.

The PVD process is an atomic deposition wherein the deposition material is vaporized from solid sources in the form of atoms or molecules, by means of gases at low pressure (plasma) in the direction of the external contact base of the piston ring 1, the surface upon which the gases condense. The formation of the coating of the base depends on the materials vaporized and the material of the base, the conditions of the base, the energy available (temperature and ion bombardment) and the atmosphere (chemical reactions, reactive deposition, etc).

In this respect, the present invention discloses a piston ring 1 comprising a coating 4 having as essential feature a multilayer configuration, that is to say multiple layers deposited sequentially up to a thickness such as to confer excellent resistance to wear. This coating 4 is applied preferably, but not obligatorily, by a physical vapor deposition (PVD)

process by a method of high power impulse magnetron sputtering (HiPIMS), and may be also applied by a cathodic arc deposition process.

Figure 2:
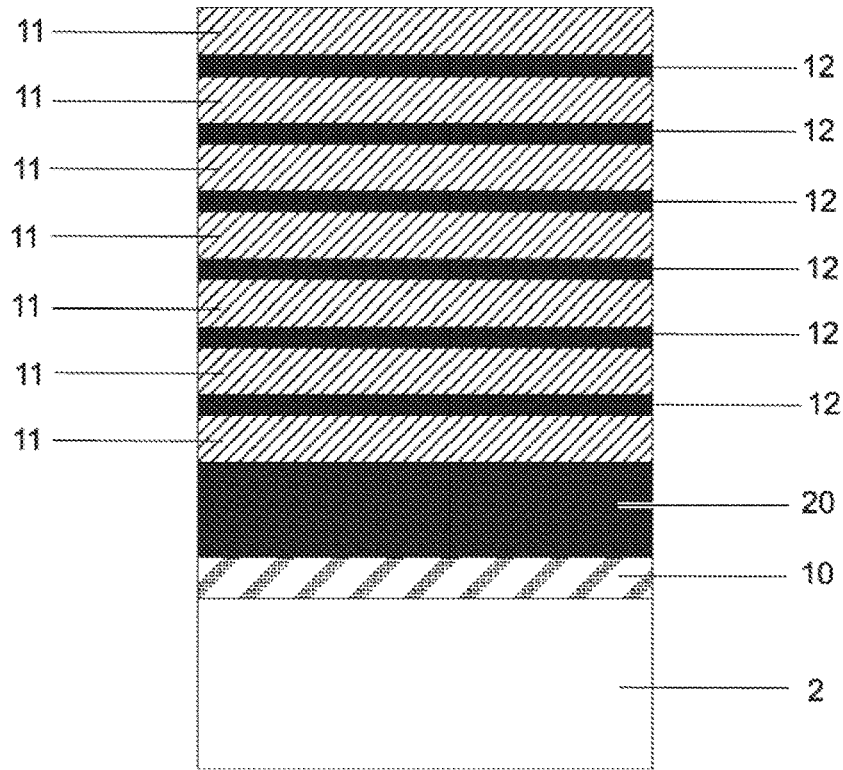
FIG. 2 shows a representation of the coating applied to the piston ring of the present invention.

The piston ring 1 of the present invention permits a first preferential, but not obligatory, configuration wherein the ring 1 is provided with a substantially annular base 2 of a ferrous alloy upon which is applied a coating 4 comprising a first bonding layer 10 and at least a first external layer 11 or a second external layer 12 deposited upon the first bonding layer 10 up to a maximum of 100 micrometers in thickness of a plurality of sequentially deposited first and second external layers 11, 12 (cf. FIGS. 1 and 2).

The first external layer 11 is composed of a nitride of a doped metal chemical element (x), the doping element being aluminum (Al), and the second external layer 12 composed of a nitride of the metal chemical element (x).

The metal chemical element (x) is selected from among chromium (Cr) or titanium (Ti) or niobium (Nb). Consequently, the first external layer 11 is composed of doped chromium nitride (CrAlN) and the second external layer 12 is composed of chromium nitride (CrN). In the same manner, if titanium is utilized, the first external layer 11 is composed of doped titanium nitride (TiAlN) and the second external layer 12 is composed of titanium nitride (TiN). Should niobium be utilized, the first external layer 11 is composed of doped niobium nitride (NbAlN) and the second external layer 12 is composed of niobium nitride (NbN).

The coating 4 of the piston ring 1 of the present invention furthermore comprises the deposition of a second bonding layer 20 deposited upon the first bonding layer 10. The first bonding layer 10 is composed of chromium (Cr) or chromium/aluminum (CrAl) and the second bonding layer 20 is composed of a doped chromium nitride, the doping element being aluminum (CrAlN), or of a chromium nitride (CrN).

The first bonding layer 10 and the second bonding layer 20, as their names indicate, provide the bond between the base 2 composed of a soft ferrous material and the coating 4 composed of a hard material, performing the transition from the soft material to the hard material, ensuring the adherence of the coating 4 to the base 2. It should be noted that the deposition of the second bonding layer 20 is optional. In this case, the coating 4 comprises solely the first bonding layer 10.

The coating 4 comprises a thickness of between 10 and 100 micrometers such that the first external layer 11 and the second external layer 12 are provided with thicknesses on a scale of the order of nanometers, being a thickness of 1 nanometer, optionally 2 nanometers, optionally 3 nanometers, optionally 10 nanometers, optionally any variation in dimension up to 200 nanometers.

The first external layer 11 is provided with a thickness greater than at least once, and up to a maximum of ten times, the thickness of the second external layer 12, resulting in the following expression for the thicknesses: $1 < XAlN/XN < 10$, that is to say the ratio between the thickness of the first external layer 11 (XAlN) and the second external layer 12 (XN) shall be greater than 1 and less than 10.

From the expression described, it is understood that the first external layer 11 shall have a thickness exceeding the thickness of the second external layer 12. This fact arises by virtue of the fact that the first external layer 11 comprises the doping element aluminum (Al), which offers low or no oxidation and high ductility. Such properties confer on the aluminum (Al) a greater capacity for elastic deformation, in this manner being capable of absorbing stresses and increasing the resistance to wear. In this manner, the coating 4, present in the form of external coatings 11, 12, confers high resistance to wear and low internal stress, by virtue of the fact that the thicker first external layer 11 of the coating 4 is composed of aluminum (Al).

Moreover, the coating 4 comprises the first external layer 11 and the second external layer 12 deposited sequentially having a periodicity which may extend to thousands of layers, comprising from two deposited layers, being a first external layer 11 and a second external layer 12, three deposited layers, four deposited layers, five deposited layers, six deposited layers, 100 deposited layers, 500 deposited layers, 1000 deposited layers, etc. The final deposited layer of the coating 4 will be a first external layer 11 or a second external layer 12.

The principal technical effect achieved through the present invention is based upon the fact that these layers function as interfaces or barriers acting against the propagation of fissures in the coating 4, in this manner increasing the resistance of the coating 4 in terms of detachment from the base 2.

In a preferential configuration, the PVD coating process of the present invention was performed in a vacuum reactor comprising cathodes or sources of material of unbalanced magnetron sputtering (UMB) and high power impulse magnetron sputtering (HiPIMS), the UMB and HiPIMS cathodes functioning simultaneously for the supply of coating material.

The HiPIMS deposition process makes use of a phenomenon consisting in substantially increasing the energy (greater velocity) with which the ions reach the metal base 2 upon which the growth of the coating 4 occurs, a considerable modification in the structure and morphology of the coating 4 being observed.

The HiPIMS deposition process furthermore permits the ionization of the material, generally metal (Cr, Ti, Mo, Nb, Al, etc), prior to the conversion into nitride. For its part, the high energy acceleration of the metal ions against the surface of the coating 4 allows the relaxation of the coating 4 during the growth thereof to be obtained, without loss of the hardness thereof.

As a natural consequence of the high energy of the ions forming the coating 4, particularly of the HiPIMS process, a significant densification of the coating 4 occurs, resulting in a reduction in the porosity and an excellent adhesion of the ions on the base 2.

Furthermore, this process permits another advantage, rendering possible the growth of the coating 4 free of droplets (microparticles). Consequently, the HIPIMS process for deposition of coatings 4 allows excellent tribological properties to be achieved, such as resistance to wear and to detachment.

Figure 3:
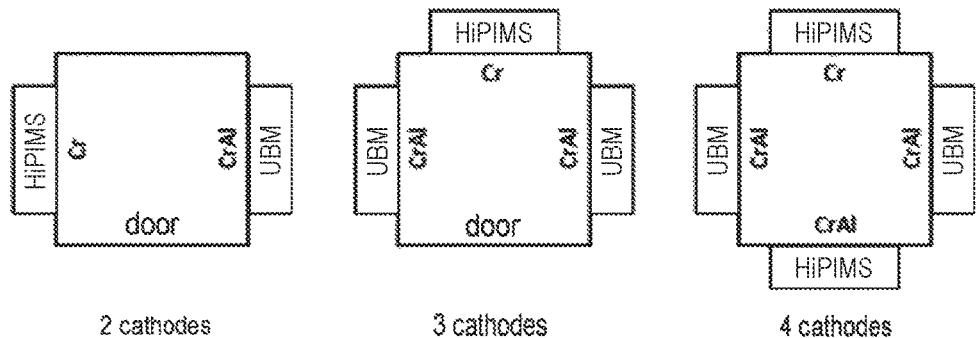
FIG. 3 shows a constructional representation of the process of deposition of the coating of the present invention.

It can be seen from FIG. 3 that the PVD coating process of the present invention comprises at least two cathodes, i.e. a UMB cathode depositing chromium aluminum (CrAl), and an HiPIMS cathode comprising the deposition of chromium metal (Cr), configuring the alternation required in the deposition of the external layers 11, 12 of the coating 4.

In another possible configuration, the PVD process of the present invention comprises three cathodes, i.e. two UMB cathodes, depositing chromium aluminum (CrAl), and an HiPIMS cathode, performing the deposition of chromium metal (Cr).

The PVD process furthermore permits a third possible configuration comprising four cathodes, i.e. two UMB cathodes, an HiPIMS cathode depositing chromium aluminum (CrAl), and a second HiPIMS cathode performing the deposition of chromium metal (Cr).

It should be noted that the vacuum reactor contains an even or odd number of cathodes, the selection between one, two, three, four, five, six, etc, cathodes depending on each project and requirement.

In this manner, the coating process of the present invention allows the deposition of the external layers 11, 12 on a nanometric scale of alternating materials, consequently improving the antioxidant properties, whilst the adjustments to the parameters of the process result in a lower internal stress, improving the resistance to fragmentation and detachment of the coating.

Figure 4:
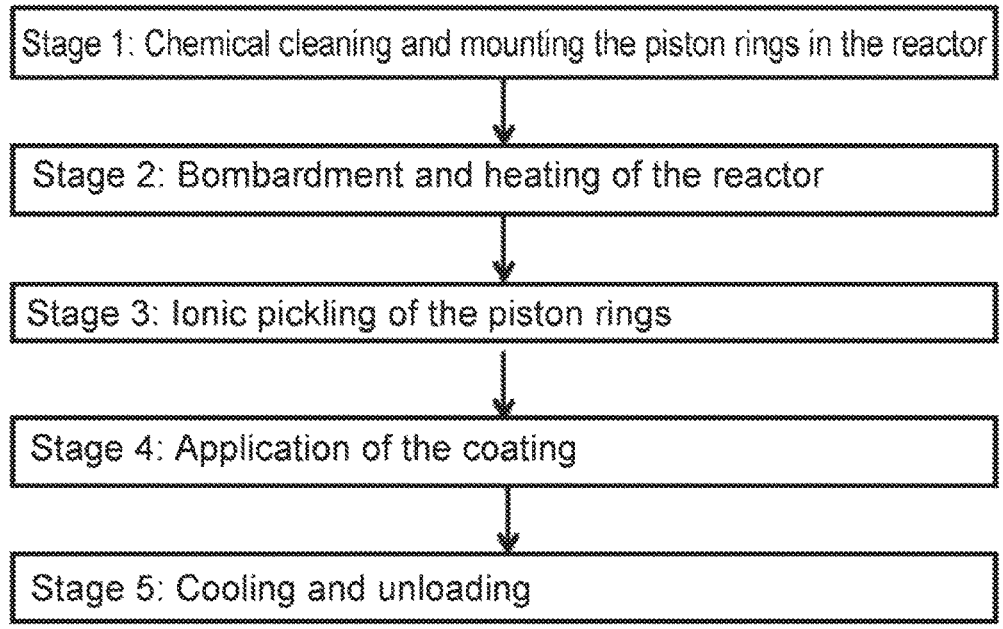
FIG. 4 shows a flow diagram of the stages of the process of the present invention.

Preferably, the PVD coating process of the present invention comprises a vacuum reactor provided with four cathodes, at least one being an HiPIMS cathode, and five stages of application of the coating 4 (cf. FIG. 4). These are:

Stage 1. Chemical cleaning and mounting the piston rings 1 in the vacuum reactor. Prior to the mounting of the piston rings 1 in the reactor, cleaning is performed by means of chemical solutions which remove all the oiliness from the surface of the base 2 of the rings 1.

Stage 2. Bombardment and heating of the reactor. The piston rings 1 must be degasified in order to prevent any contamination. Stage 2 comprises a temperature of up to 400° C. at a pressure lower than 0.00007 mbar (millibars), with a duration of 90 minutes.

Stage 3. Ionic pickling of the piston rings 1, provided by an HiPIMS cathode to clean the surface of the base 2. The bias potential between the coating plasma and the surface of the base 2 provides the bombardment of chromium ($Cr^+$) upon the surface to be coated, such process being provided by the sputtering of the surface. Stage 3 occurs in an atmosphere of pure argon and at a constant velocity of 5 rpm (revolutions per minute), a temperature of up to 400° C., a pressure of 0.001 mbar (millibars), a pulsation frequency of chromium of 5.5 kW (kilowatts) and 100 Hz (hertz), a bias potential of −1.0 V (volts) and a duration of 30 minutes.

Stage 4. Application of the multilayer coating 4 provided upon the base 2 of the piston ring 1. The chromium aluminum (CrAl) and chromium (Cr) cathodes are positioned alternately, depositing ternary material (CrAlN), first external layer 11, and binary material (CrN), second external layer 12, upon the external surface of the base 2 of the ring 1. It should be noted that the chromium ($Cr^+$) is responsible for the ionic bombardment of the coating 4 being deposited upon the surface, alleviating stresses of the coating 4.

Alternatively, it is possible to perform stage 4 comprising solely a second bonding layer 20 (CrAlN) deposited upon the first bonding layer 10 (Cr), the second bonding layer 20 functioning as a support layer for application of the external layers 11, 12. In this configuration, the second bonding layer 20 is sputtered by cathodes of chromium nitride (CrN).

Stage 4 takes place in an atmosphere comprising a mixture of 50% argon and nitrogen at a temperature between 400° C. and 420° C. and a pressure of 0.0022 mbar (millibars). The UBM cathodes deposit chromium aluminum (CrAl) with a pulsation frequency of 8.0 kW (kilowatts) and 23.0 Hz (hertz), a first HiPIMS cathode depositing chromium (Cr) with a frequency of 8.0 kW (kilowatts) and 400 Hz (hertz) and a second HiPIMS cathode depositing chromium aluminum (CrAl) with a frequency of 8.0 kW (kilowatts) and 400 Hz (hertz). Stage 4 furthermore takes place with a bias potential of −65 V (volts) and has an average duration of 600 minutes, varying in accordance with the final thickness of the coating 4 deposited.

Stage 5. Cooling and unloading the piston rings 1. Subsequent to the complete application of the coating 4, the piston rings 1 are kept within the vacuum reactor in order for the system to cool to below 100° C., for the rings 1 then to be removed and the coating process recommenced with new rings 1 to be coated. Stage 5 is initiated at a temperature of 420° C. until the ambient temperature is reached, at a pressure of 0.0022 mbar (millibars) to atmospheric pressure, with a duration of 90 minutes.

Tests have been performed on engines to evaluate the resistance to wear of the piston ring 1 of the present invention and of the adherence of the coating 4 to the base 2 of the piston ring 1. The tests were performed on three piston rings 1 of the present invention mounted in a high load diesel engine and two piston rings 1 of the present invention mounted in a high speed diesel engine.

The first wear evaluation test was performed in a high load diesel engine and the rings 1 were submitted to accelerated thermal shock tests in dynamometers over 250 hours, wherein the conditions of thermal deformation of the block and of the cylinder linings of the engine, in addition to severe conditions of rupture of the oil film, were particularly observed on the working surfaces of the ring 1. It should furthermore be noted that the cylinder linings and piston rings 1 were obtained from the same production batches in order to minimize, as far as possible, the variations involved.

Figure 5:
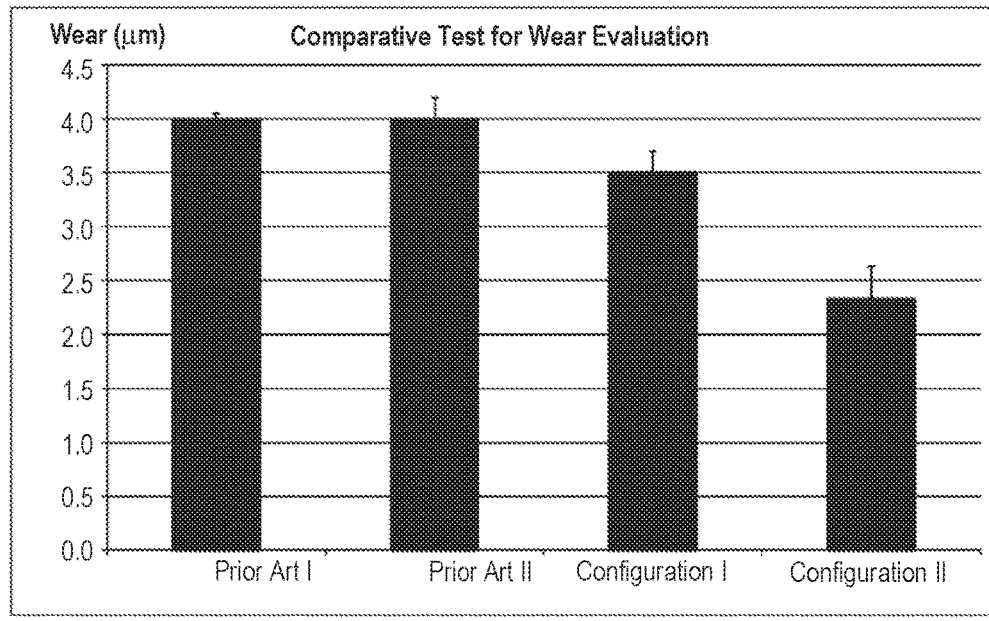
FIG. 5 shows a graphic representation of a comparative test for the evaluation of wear between the piston rings of the prior art and the piston rings of the present invention.

FIG. 5 presents the graphical result of the above-described comparative wear evaluation test, the prior art I being a piston ring 1 provided with monolayer coating 4 comprising chromium nitride (CrN) deposited by cathodic arc, whilst the prior art II comprises a coating 4 similar to that of the prior art I, but deposited by high power impulse magnetron sputtering (HiPIMS).

The graphic of FIG. 5 additionally presents a piston ring 1 of the present invention in a configuration I furnished with a multilayer coating 4 comprising the sequentially deposited external layers 11, 12 of chromium nitride doped with aluminum (CrAlN) and chromium nitride (CrN) deposited by cathodic arc; and the configuration II comprised a coating 4 similar to that of configuration I, deposited however by high power impulse magnetron sputtering (HiPIMS).

From FIG. 5 it can clearly be seen that the piston ring 1 of the present invention presents minimal wear in relation to the prior art, on the basis that the piston rings 1 of the prior art I and II present wear of approximately 4.0 micrometers, whereas the configurations I and II of the present invention present, respectively, 3.5 and 2.3 micrometers of wear. In this manner, configuration II of the piston ring 1 of the present invention presented a wear approximately 50% less in relation to the prior art I and II. For its part, the configuration I of the present invention, although it clearly did not yield results which were as good as the configuration II of the present invention, nevertheless yielded satisfactory results, demonstrating great advantages with respect to the prior art for application in combustion engines.

The second test was performed in a high speed diesel engine over 500 hours, utilizing as prior art II a piston ring 1 provided with a monolayer coating 4 comprising titanium nitride doped with aluminum (TiAlN) and the piston ring 1 of the present invention in the configuration II thereof.

Figure 6:
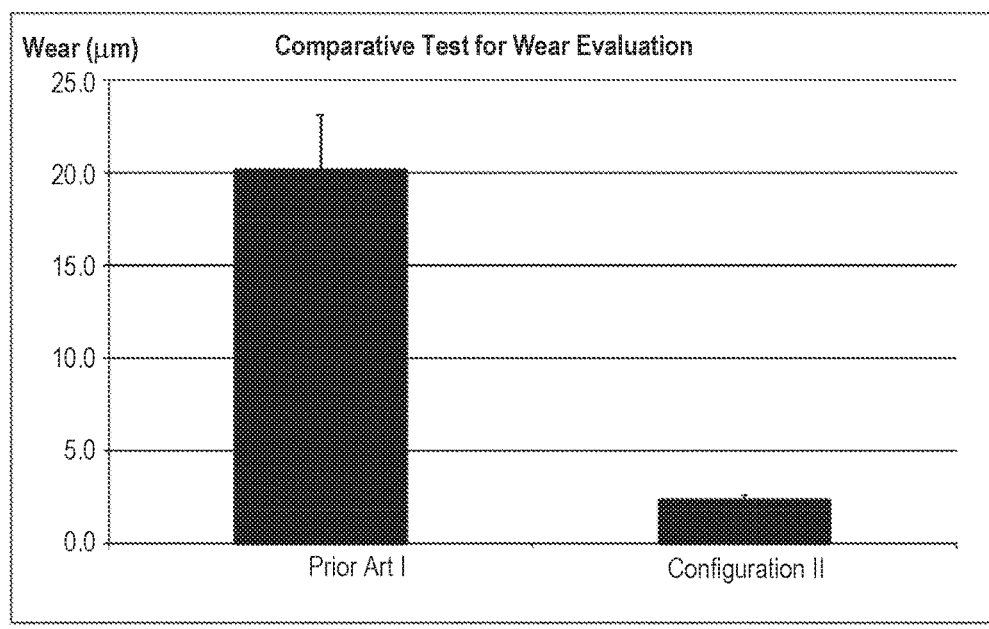
FIG. 6 shows a graphic representation of a comparative test for the evaluation of wear performed between the piston rings of the prior art and the piston rings of the present invention.

Again, the piston ring 1 of the present invention yielded excellent results, revealing a wear of 2.3 micrometers, whilst the ring 1 of the prior art III presented a wear of 20.1 micrometers. In this manner, the ring 1 of the present invention presented approximately 80% less wear in relation to the ring 1 of the prior art III (cf. FIG. 6).

Furthermore, the piston rings of the prior art I, II and III presented detachment of the coating 4 from the base 2, whilst the piston rings 1 of the present invention assured the adherence of the coating 4 to the base 2.

It should be noted moreover that the coating 4 of the piston ring 1 of the present invention presents a porosity of less than 6%, preferably presenting a porosity of 3%, with a hardness between 1800 and 2500 HV (Vickers hardness) and an internal stress of between 200 and 700 MPa (megapascals), preferably an internal stress of between 300 and 600 MPa (megapascals).

The specific arrangement of the PVD process of the present invention, together with the parameters of the process and the selection of the materials, allows coatings having a thickness of up to 60 micrometers to be obtained, without prejudicing the structure of the coating and the mechanical strength.

The piston ring 1 of the present invention is provided with a coating 4 having a high resistance to wear, low internal stress, in this manner preventing the formation of macroparticles or discontinuities of the structure, resulting in a high resistance to fragmentation and the prevention of the detachment of the coating 4 from the base 2 of the piston ring 1.

An example of preferred embodiment having been described, it shall be understood that the scope of the present invention covers other possible variations, being limited solely by the content of the appended claims, therein included the possible equivalents.

The invention claimed is:

1. A piston ring for an internal combustion engine comprising a substantially annular base of a ferrous alloy upon which is applied a coating having:
    a first bonding layer, and
    at least a first external layer or a second external layer deposited upon the first bonding layer up to a maximum of 100 micrometers in thickness of a plurality of sequentially deposited first and second external layers,
    wherein the first external layer includes a nitride of a doped metal chemical element, doping element being aluminum,
    wherein the second external layer includes a nitride of the metal chemical element,
    wherein the first external layer has a thickness greater than at least once a thickness of the second external layer and less than ten times the thickness of the second external layer,
    wherein the coating further comprises a second bonding layer deposited upon the first bonding layer.

2. The piston ring as claimed in claim 1, wherein the metal chemical element is one of chromium, titanium, or niobium.

3. The piston ring as claimed in claim 1, wherein the first and second external layers are each provided with a thickness of between 1 and 200 nanometers.

4. The piston ring as claimed in claim 1, wherein the first bonding layer includes one of chromium or chromium/aluminum and the second bonding layer includes a doped chromium nitride, wherein a doping element is one of aluminum or a chromium nitride.

5. The piston ring as claimed in claim 1, wherein the coating has a hardness between 1800 and 2500 HV.

6. The piston ring as claimed in claim 1, wherein the coating has a porosity from 3% to 6%.

7. The piston ring as claimed in claim 1, wherein the coating has an internal stress of between 200 and 700 MPa.

8. An internal combustion engine comprising at least one piston ring-having a substantially annular base of a ferrous alloy upon which is applied a coating having:
    a first bonding layer, and
    at least a first external layer or a second external layer deposited upon the first bonding layer up to a maximum of 100 micrometers in thickness of a plurality of sequentially deposited first and second external layers,
    wherein the first external layer includes a nitride of a doped metal chemical element, a doping element being aluminum,
    wherein the second external layer includes a nitride of the metal chemical element,
    wherein the first external layer has a thickness greater than at least once a thickness of the second external layer and less than ten times the thickness of the second external layer, and
    wherein the coating further comprises a second bonding layer deposited upon the first bonding layer.

9. The internal combustion engine as claimed in claim 8, wherein the metal chemical element is one of chromium, titanium, or niobium.

10. The internal combustion engine as claimed in claim 8, wherein the first bonding layer includes one of chromium or chromium/aluminum and the second bonding layer includes a doped chromium nitride, wherein a doping element is one of aluminum or a chromium nitride.

11. The internal combustion engine as claimed in claim 8, wherein the coating has a hardness between 1800 and 2500 HV.

12. The internal combustion engine as claimed in claim 8, wherein the coating has a porosity from 3% to 6%.

13. The internal combustion engine as claimed in claim 8, wherein the coating has an internal stress of between 200 and 700 MPa.

* * * * *